United States Patent
Luo et al.

(10) Patent No.: US 9,198,318 B2
(45) Date of Patent: Nov. 24, 2015

(54) DATA STORAGE MODULE

(71) Applicant: Wistron Corporation, New Taipei (TW)

(72) Inventors: Yi-Chieh Luo, New Taipei (TW);
Li-Sheng Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 223 days.

(21) Appl. No.: 13/682,715

(22) Filed: Nov. 20, 2012

(65) Prior Publication Data

US 2013/0156494 A1    Jun. 20, 2013

(30) Foreign Application Priority Data

Dec. 16, 2011    (TW) .............................. 100146831 A

(51) Int. Cl.
  *H05K 7/14*    (2006.01)
  *G06F 1/16*    (2006.01)
  *G06F 1/18*    (2006.01)

(52) U.S. Cl.
  CPC ................ *H05K 7/14* (2013.01); *G06F 1/1658* (2013.01); *G06F 1/187* (2013.01); *Y10T 403/595* (2015.01)

(58) Field of Classification Search
  CPC ............ F16B 1/00; F16B 17/00; F16B 21/02; H05K 7/14; H05K 7/1401; H05K 7/1411; G06F 1/187
  USPC ............................ 403/321, 322.1, 322.4, 330; 361/679.37–679.39; 439/160
  See application file for complete search history.

(56) References Cited

U.S. PATENT DOCUMENTS

| | | | | |
|---|---|---|---|---|
| 5,057,029 A | * | 10/1991 | Noorily | 439/160 |
| 5,364,282 A | * | 11/1994 | Tondreault | 439/157 |
| 5,634,803 A | | 6/1997 | Cheng | |
| 5,906,497 A | * | 5/1999 | Pham et al. | 439/160 |
| 5,928,015 A | * | 7/1999 | Tondreault | 439/157 |
| 6,932,633 B2 | * | 8/2005 | Tsai | 439/160 |
| 7,938,658 B1 | * | 5/2011 | Zeng et al. | 439/160 |
| 2005/0148223 A1 | * | 7/2005 | Shirk et al. | 439/160 |
| 2010/0033919 A1 | * | 2/2010 | Yu et al. | 361/679.33 |
| 2011/0255235 A1 | * | 10/2011 | Chen | 361/679.33 |

FOREIGN PATENT DOCUMENTS

| | | |
|---|---|---|
| GB | 2 241 841 A | 9/1991 |
| JP | 06203937 A * | 7/1994 ............ H01R 33/76 |

OTHER PUBLICATIONS

Office action mailed on Dec. 5, 2013 for the Taiwan application No. 100146831, filing date: Dec. 16, 2011, p. 1 line 13-14, p. 2 line 1-17 and line 25-26 and p. 3 line 1-2.
Office action mailed on Jul. 21, 2015 for the China application No. 201210001577.5, p. 3 line 5-31 and p. 4-5.

* cited by examiner

*Primary Examiner* — Daniel P Stodola
*Assistant Examiner* — Jonathan Masinick
(74) *Attorney, Agent, or Firm* — Winston Hsu; Scott Margo

(57) ABSTRACT

A fixing mechanism for fixing a data storage device is disclosed. The fixing mechanism includes a first latching member, a second latching member and a pressing member. The first latching member is for latching a first hole, so as to fix a first side of a data storage device. The second latching member is connected to the first latching member for latching a second hole, so as to fix a second side of the data storage device. The pressing member is connected to the second latching member. The pressing member drives the second latching member to rotate in a first direction as being pressed, so as to separate the second latching member from the second hole, and further drives the first latching member to rotate in the first direction, so as to push the first side of the data storage device for lifting the data storage device.

7 Claims, 10 Drawing Sheets

DATA STORAGE MODULE

BACKGROUND OF THE INVENTION

1. Field of the Invention

The present invention relates to a fixing mechanism for fixing a data storage device and a data storage module therewith, and more particularly, to a fixing mechanism without utilizing screws and a data storage module therewith.

2. Description of the Prior Art

Notebook computers need to be taken apart when replacing broken components or upgrading components inside the notebook computers. Therefore, it is important to facilitate users to use the notebook computers capable of being disassembled easily. Further, a data storage device, such as a hard disk drive, is one of the key components of the notebook computer. Accordingly, it is significantly important for the notebook computer to be installed with the hard disk drive capable of being disassembled easily. However, screws are conventionally used for fixing the hard disk drive with a casing of the notebook computer. When the hard disk drive is desired to be replaced, the screws need to be unscrewed in advance. After a new hard disk drive is installed, the screws need to be re-screwed. As a result, the conventional design results in more complexity and labor time during the assembly and disassembly process. In addition, during the assembly and disassembly process, the screws are often lost, resulting in inconvenience when the conventional hard disk drive is replaced.

SUMMARY OF THE INVENTION

Thus, the present invention provides a fixing mechanism without utilizing screws and a data storage module therewith for solving above drawbacks.

According to the claimed invention, a fixing mechanism for fixing a data storage device is disclosed. A first hole is formed on a first side of the data storage device, and a second hole is formed on a second side of the data storage device. The fixing mechanism includes a first latching member, a second latching member and a pressing member. The first latching member is for latching the first hole, so as to fix the first side of the data storage device. The second latching member is connected to the first latching member for latching the second hole, so as to fix the second side of the data storage device. The pressing member is connected to the second latching member. The pressing member drives the second latching member to rotate in a first direction as being pressed, so as to separate the second latching member from the second hole, and further drives the first latching member to rotate in the first direction, so as to push the first side of the data storage device for lifting the data storage device.

According to the claimed invention, the first latching member comprises a first protruding structure, the second latching member comprises a second protruding structure, and the first protruding structure and the second protruding structure are for latching the first hole and the second hole, respectively.

According to the claimed invention, the first latching member, the second latching member and the pressing member are perpendicular to one another.

According to the claimed invention, the first latching member, the second latching member and the pressing member are integrally formed.

According to the claimed invention, the fixing mechanism further includes an installing member and a pivot member. The installing member is for installing the data storage device onto a casing. Openings are formed on the installing member in positions respectively corresponding to the first hole and the second hole for allowing the first latching member and the second latching member to pass through, such that the first latching member and the second latching member latch the first hole and the second hole, respectively. The pivot member is disposed on the installing member and pivoted to the first latching member and the second latching member. The first latching member and the second latching member are driven by the pressing member to respectively rotate relative to the pivot member in the first direction when the pressing member is pressed. The first latching member is driven by the data storage device such that the first latching member and the second latching member are respectively rotated relative to the pivot member in a second direction opposite to the first direction when the data storage device is installed onto the casing.

According to the claimed invention, the pressing member is installed inside a guiding slot in a slidable manner, such that the fixing mechanism moves relative to the casing between a expanding position and a containing position.

According to the claimed invention, the installing member comprises a first stopping structure for abutting against a second stopping structure of the casing when the installing member moves to the expanding position relative to the casing.

According to the claimed invention, a guiding structure is formed on the pressing member for guiding the pressing member when the pressing member is installed inside the guiding slot.

According to the claimed invention, the fixing mechanism further includes a resilient member sheathing the second latching member for driving the pressing member to rotate the first latching member and the second latching member respectively relative to the pivot member in the first direction when the pressing member is separated from the guiding slot.

According to the claimed invention, a data storage device includes a data storage device and a fixing mechanism. A first hole and a second hole are respectively formed on a first side and a second side of the data storage device. The fixing mechanism includes a first latching member, a second latching member and a pressing member. The first latching member is for latching the first hole, so as to fix the first side of the data storage device. The second latching member is connected to the first latching member for latching the second hole, so as to fix the second side of the data storage device. The pressing member is connected to the second latching member. The pressing member drives the second latching member to rotate in a first direction as being pressed, so as to separate the second latching member from the second hole, and further drives the first latching member to rotate in the first direction, so as to push the first side of the data storage device for lifting the data storage device.

In summary, since the present invention utilizes the first latching member and the second latching member to latch the first side and the second side of the data storage device, respectively, the present invention can omit screwing components such as screws. When the pressing member of the fixing mechanism of the present invention is pressed, the pressing member drives the second latching member to rotate in the first direction, so as to separate the second latching member from the second hole, such that the second latching member releases constraint on the data storage device. Furthermore, the pressing member simultaneously drives the first latching member to rotate in the first direction as well for lifting the data storage device. Accordingly, the fixing mechanism of the present invention is not only capable of fixing the data storage device without utilizing the screwing components, such as the screws, but also capable of lifting the data storage device when the second latching member releases constraint on the data storage device. In other words, the present invention can utilize one single motion, i.e. operation of pressing the pressing member, to achieve releasing latching of the data storage device and lifting the data storage device simultaneously. In such a manner, the fixing mechanism of the present invention not only facilitates users to take and replace the data storage device, but also simplifies assembly and disassembly process of the data storage device, so as to reduce labor time of assembly and disassembly of the data storage device.

These and other objectives of the present invention will no doubt become obvious to those of ordinary skill in the art after reading the following detailed description of the embodiment that is illustrated in the various figures and drawings.

DETAILED DESCRIPTION

Figure 1:
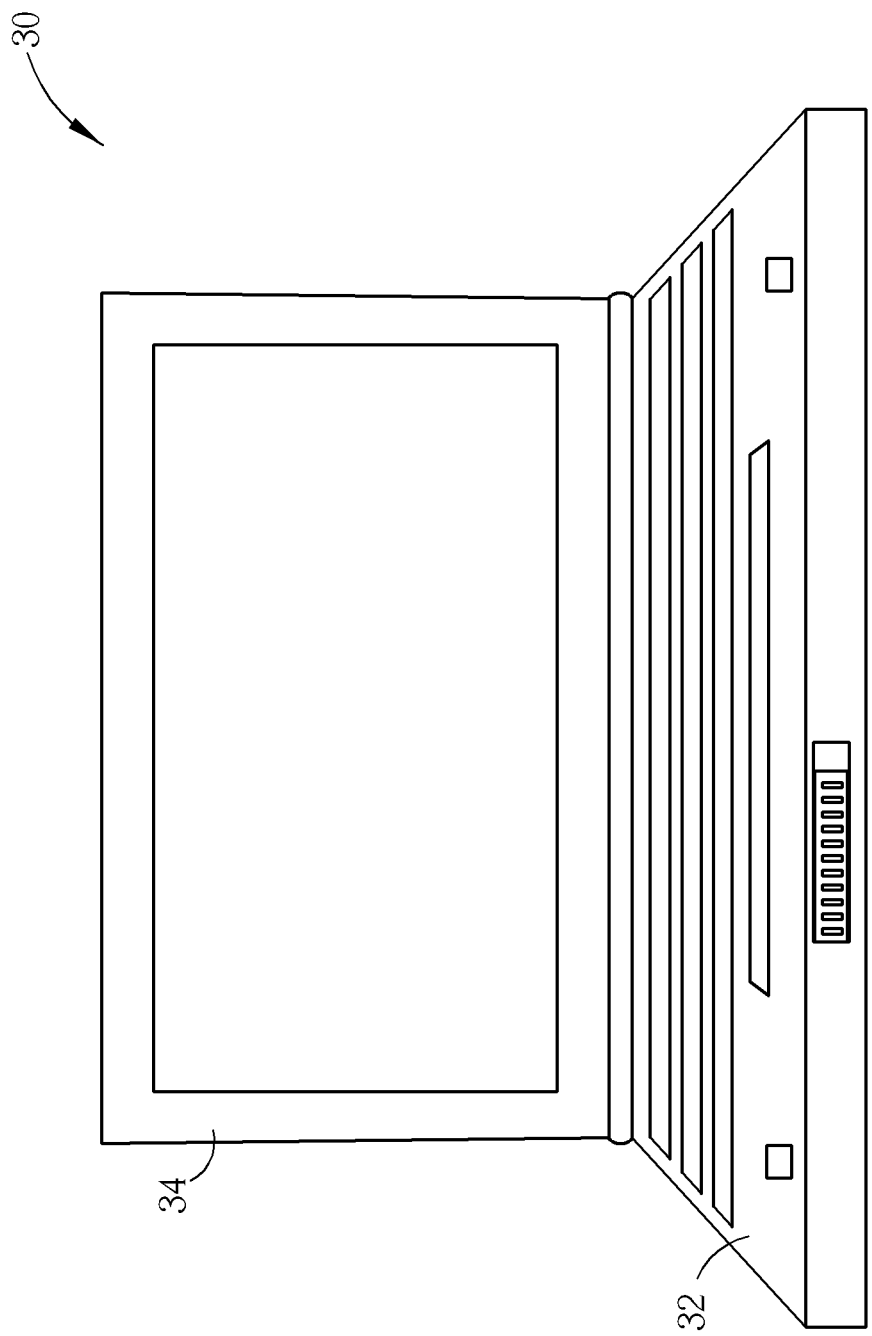
FIG. 1 is a diagram of an electronic device according to an embodiment of the present invention.

Please refer to FIG. 1. FIG. 1 is a diagram of an electronic device 30 according to an embodiment of the present invention. As shown in FIG. 1, the electronic device 30 includes a first module 32 and a second module 34. The second module 34 is pivoted to the first module 32. When the electronic device 30 is in use, the second module 34 can pivot to be expanded relative to the first module 32 for a user to operate the first module 32 and watch the second module 34. When the electronic device 30 is not in use, the second module 34 can pivot to be closed relative to the first module 32 for the user to contain or carry on. In this embodiment, the electronic device 30 can be a notebook computer, the first module 32 can be a host module with a main board, an optical disk drive and so on of the notebook computer, and the second module 34 can be a panel module with a display panel, a backlight module and so on of the notebook computer.

Figure 2:
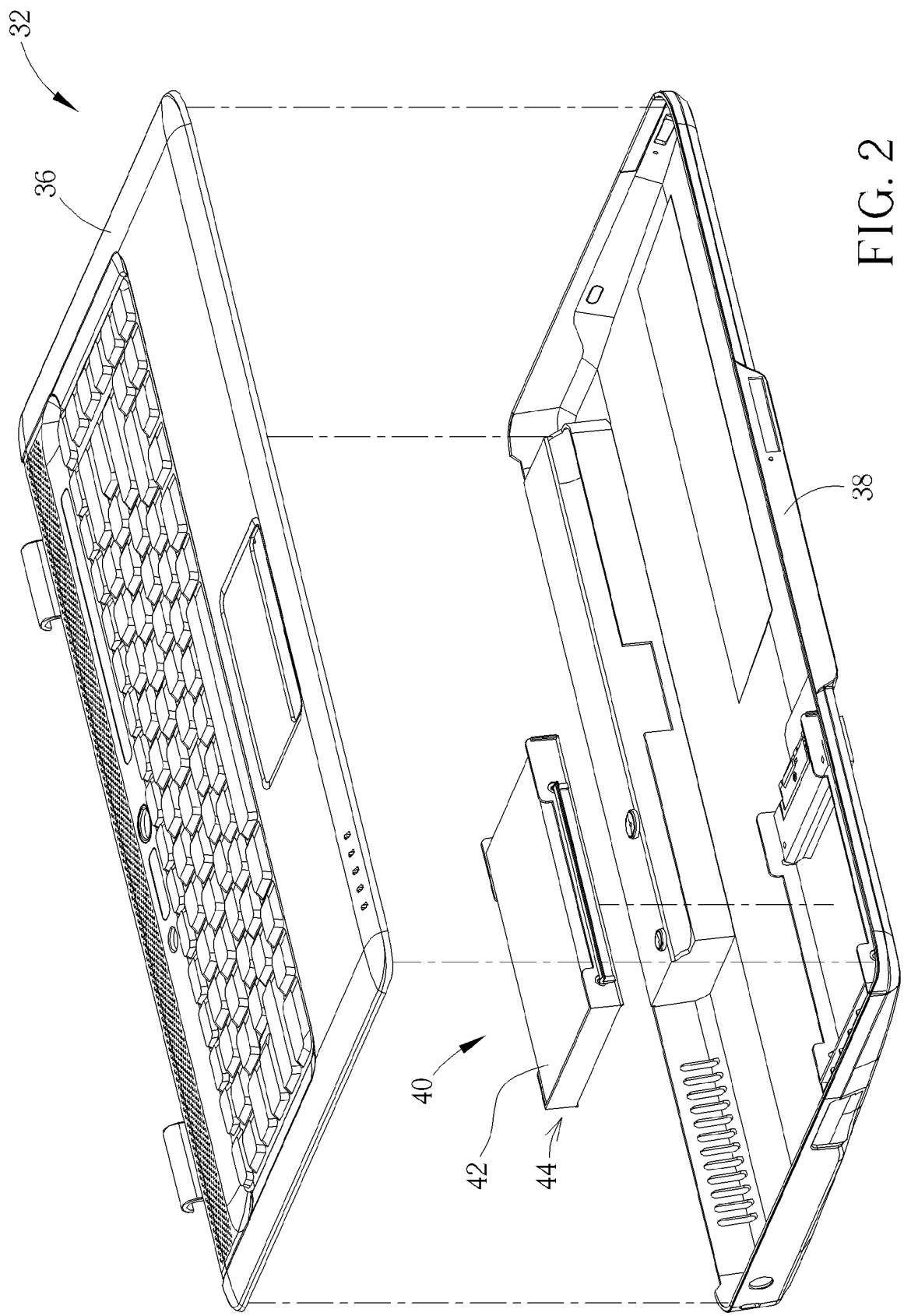
FIG. 2 is an exploded diagram of a first module according to the embodiment of the present invention.

Please refer to FIG. 2. FIG. 2 is an exploded diagram of the first module 32 according to the embodiment of the present invention. As shown in FIG. 2, the first module 32 includes an upper cover 36, a casing 38 and a data storage module 40. The upper cover 36 and the casing 38 are cooperatively used for covering the data storage module 40, so as to prevent the data storage module 40 from damaging due to collision as well as to prevent external objects from entering the first module 32 and keeps internal components of the first module 32 function normally. In addition, the data storage module 40 includes a data storage device 42 and a fixing mechanism 44. The fixing mechanism 44 is used for installing the data storage device 42 onto the casing 38, so as to fix the data storage device 42 on the casing 38. Accordingly, it can prevent the data storage device 42 from functioning abnormally due to vibration generated by the first module 32 in operation.

In this embodiment, the data storage module 40 can be a hard disk drive module implemented in the notebook computer, and the data storage device 42 can be a corresponding hard disk drive device. The implementation of the fixing mechanism 44 of the present invention can not be limited to those mentioned in the aforesaid embodiment. For example, the fixing mechanism 44 can be used for fixing a hard disk drive device implemented in the desktop computer. As for which one of the above-mentioned designs is adopted, it depends on practical demands.

Figure 3:
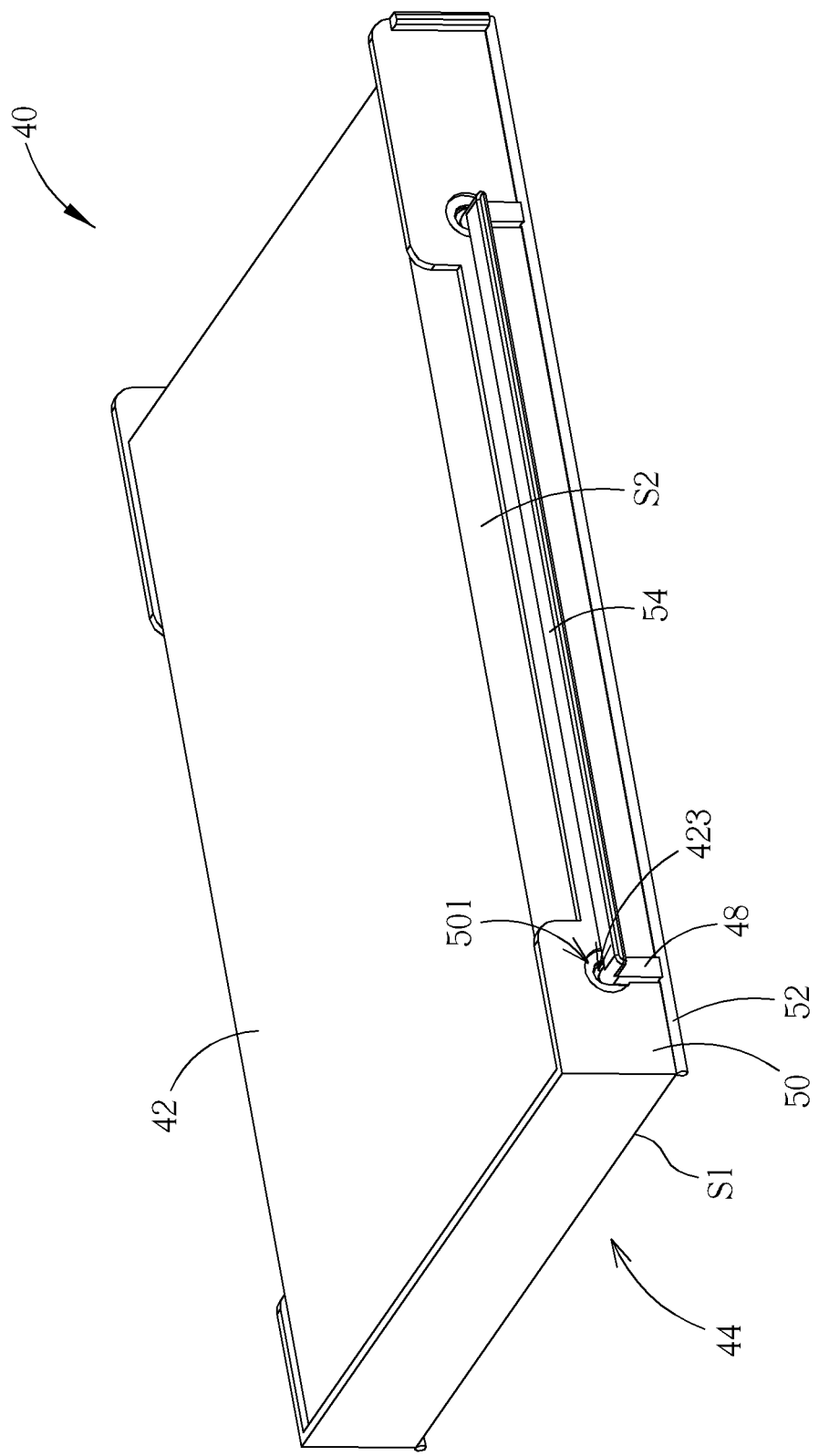
FIG. 3 is a diagram of a data storage module according to the embodiment of the present invention.
Figure 4:
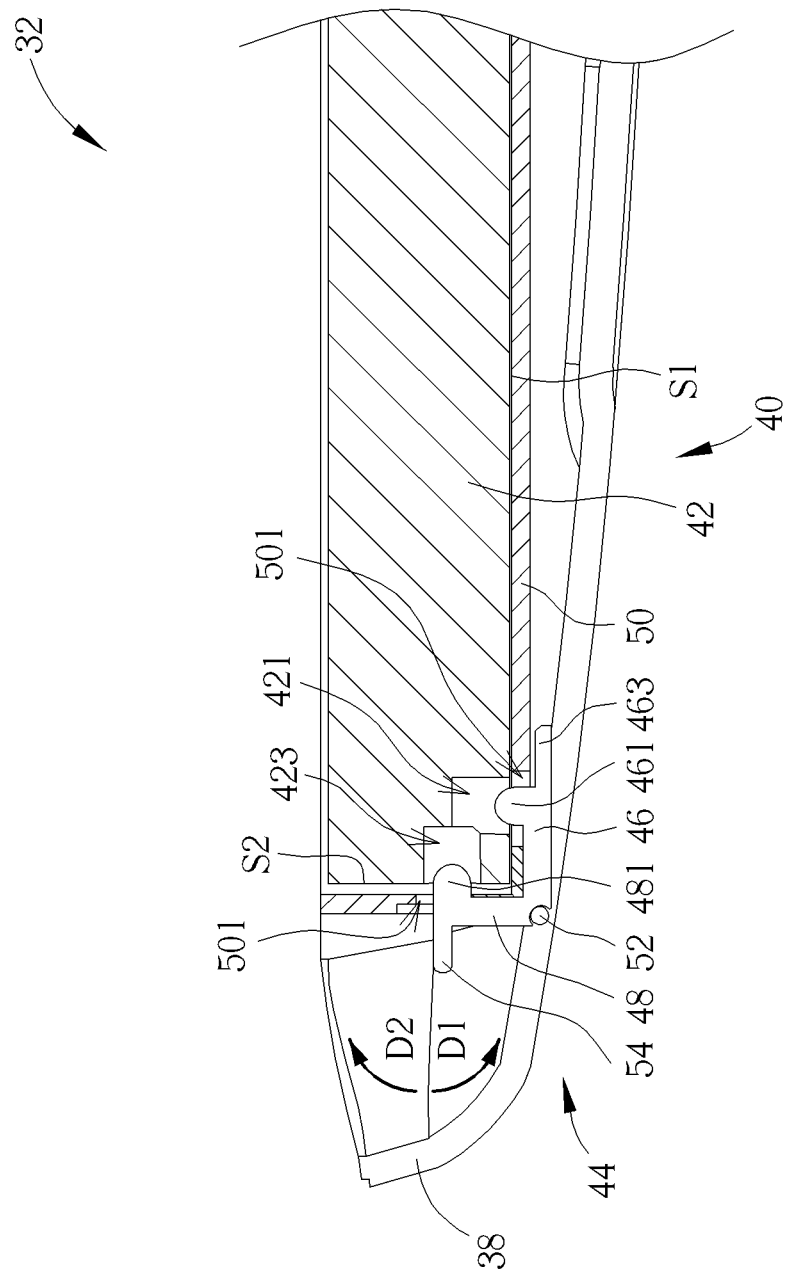
FIG. 4 is a partly sectional diagram of the data storage module in an assembly status according to the embodiment of the present invention.

Please refer to FIG. 3 and FIG. 4. FIG. 3 is a diagram of the data storage module 40 according to the embodiment of the present invention. FIG. 4 is a partly sectional diagram of the data storage module 40 in an assembly status according to the embodiment of the present invention. As shown in FIG. 3 and FIG. 4, the fixing mechanism 44 includes a first latching member 46, a second latching member 48, an installing member 50 and a pivot member 52. The installing member 50 is used for installing the data storage device 42 onto the casing 38. The first latching member 46 is connected with the second latching member 48. The pivot member 52 is disposed on the installing member 50 and pivoted to the first latching member 46. In this embodiment, the second latching member 48 and the first latching member 46 can be pivoted to the pivot member 52 in a joint of the first latching member 46 and the second latching member 48. Accordingly, the first latching member 46 and the second latching member 48 can be pivoted relative to the pivot member 52 simultaneously. It should be noticed that the installing member 50 of the present invention can be omitted. In other words, the first latching member 46, the second latching member 48 and the pivot member 52 can be installed onto the casing 38 directly. As for which one of the above-mentioned designs is adopted, it depends on practical demands.

In addition, a first hole 421 is formed on a first side S1 of the data storage device 42, and a second hole 423 is formed on a second side S2 of the data storage device 42. Furthermore, openings 501 are formed on the installing member 50 in positions corresponding to the first hole 421 and the second hole 423 for allowing the first latching member 46 and the second latching member 48 to pass through. In such a manner, the first latching member 46 and the second latching member 48 can respectively latch the first hole 421 on the first side S1 of the data storage device 42 and the second hole 423 on the second side S2 of the data storage device 42 via the openings 501, so as to fix the data storage device 42 in an assembly position in FIG. 4.

In this embodiment, the first side S1 can be a bottom side of the data storage device 42, and the second side S2 can be a lateral side of the data storage device 42, as shown in FIG. 3. By respectively latching the first latching member 46 and the second latching member 48 of the fixing mechanism 44 into the first hole 421 on the bottom side and the second hole 423 on the lateral side of the data storage device 42, the fixing mechanism 44 of the present invention can be used for installing and fixing the data storage device 42 onto the casing 38 of the first module 32, so as to prevent the data storage device 42 from functioning abnormally due to vibration generated by the first module 32 in operation. In addition, the first latching member 46 and the second latching member 48 can respectively include a first protruding structure 461 and a second protruding structure 481. The first protruding structure 461 is used for latching the first hole 421 on the first side 51 of the data storage device 42, so as to position the data storage device 42 and to prevent the data storage device 42 from displacing relative to the casing 38 of the first module 32. Similarly, the second protruding structure 481 is used for latching the second hole 423 on the second side S2 of the data storage device 42, so as to position the data storage device 42 and to prevent the data storage device 42 from separating from the casing 38 of the first module 32

Figure 5:
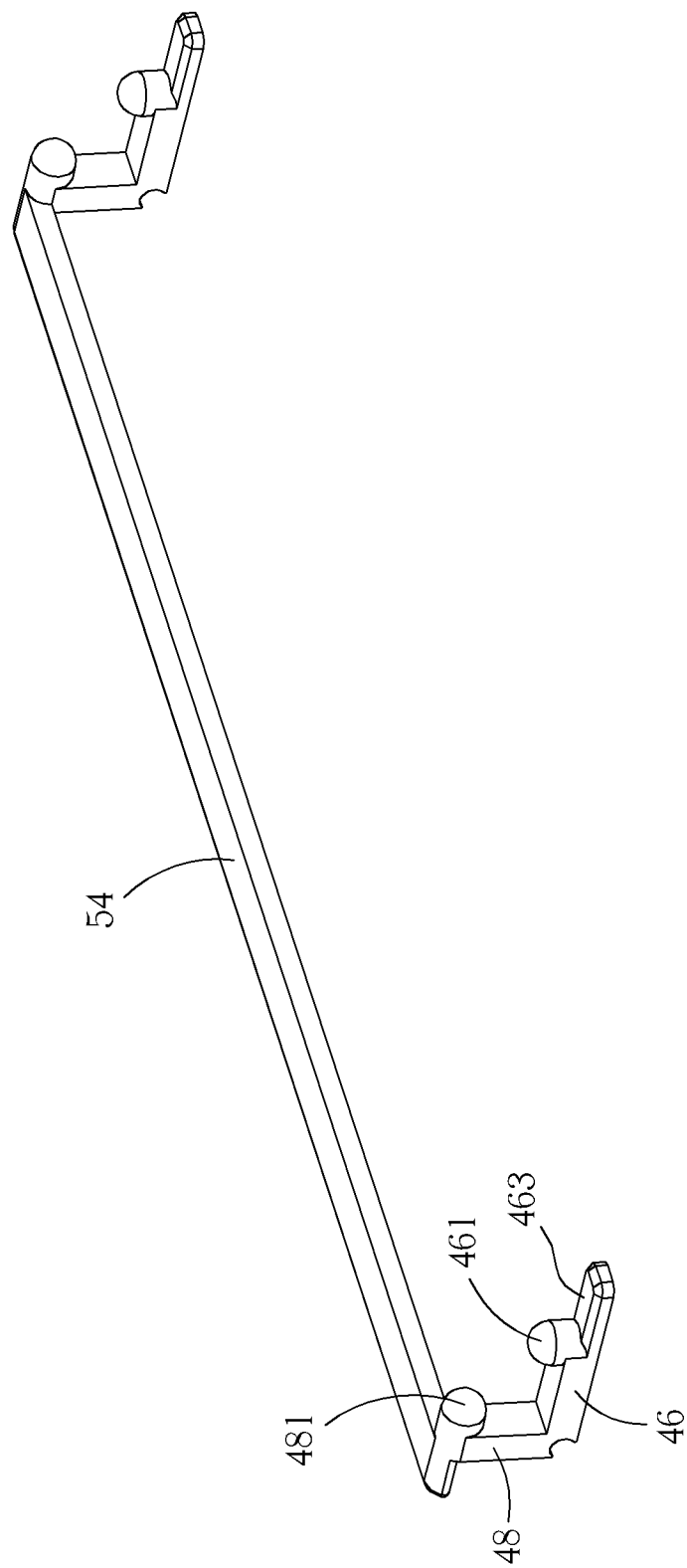
FIG. 5 is a diagram of a first latching member and a second latching member according to the embodiment of the present invention.

Please refer to FIG. 3 to FIG. 5. FIG. 5 is a diagram of the first latching member 46 and the second latching member 48 according to the embodiment of the present invention. As shown in FIG. 3 to FIG. 5, the fixing mechanism 44 further includes a pressing member 54. The pressing member 54 is connected to the second latching member 48 and is used for lifting the data storage device 42 when the data storage device 42 is detached, so as to facilitate the user to take out the data storage device 42. In this embodiment, the first latching member 46, the second latching member 48 and the pressing member 54 can be, but not limited to, perpendicular to one another. For example, angles included among the first latching member 46, the second latching member 48 and the pressing member 54 can be greater or smaller than 90 degrees. In other words, structural designs of the pressing member 54 capable of driving the second latching member 48 to rotate relative to the pivot member 52 in a first direction D1, so as to drive the first latching member 46 to lift the data storage device 42, are within the scope of the present invention. In practical application, the first latching member 46, the second latching member 48 and the pressing member 54 can be integrally formed, as shown in FIG. 5.

Figure 6:
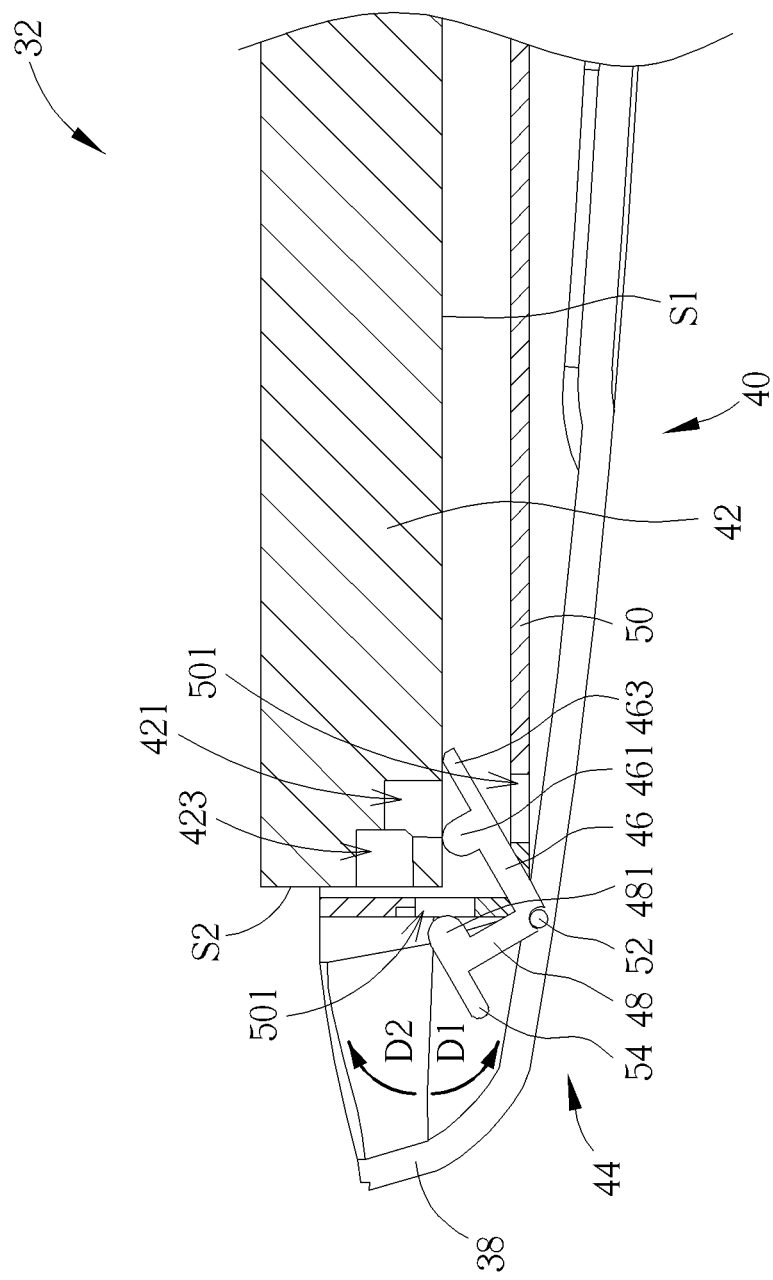
FIG. 6 is a partly sectional diagram of the data storage module in a lifted status according to the embodiment of the present invention.

Please refer to FIG. 4 and FIG. 6. FIG. 6 is a partly sectional diagram of the data storage module 40 in a lifted status according to the embodiment of the present invention. As shown in FIG. 4 and FIG. 6, when the data storage device 42 installed inside the casing 38 is to be detached, the pressing member 54 of the fixing mechanism 44 in FIG. 4 can be pressed. In the meanwhile, the pressing member 54 can drive the second latching member 48 to rotate relative to the pivot member 52 in the first direction D1. Accordingly, the second protruding structure 481 on the second latching member 48 can separate from the second hole 423 on the second side S2 of the data storage device 42, so as to release latching of the second latching member 48 for the data storage device 42. Since the first latching member 46 is capable of rotating with the second latching member 48 simultaneously, the second latching member 48 drives the first latching member 46 to rotate relative to the pivot member 52 in the first direction D1 when the second latching member 48 rotates in the first direction D1. As a result, the first latching member 46 can push the first side S1 of the data storage device 42, so as to lift the data storage device 42, until the data storage device 42 is lifted to a lifted position shown in FIG. 6. In such a manner, it can facilitate the user to take out the data storage device 42 for replacing the data storage device 42.

On the other hand, when the data storage device 42 is to be installed onto the casing 38, the first side S1 of the data storage device 42 can push the first latching member 46 of the fixing mechanism 44, so as to rotate the first latching member 46 in a second direction D2 opposite to the first direction D1, as shown in FIG. 6. In the meanwhile, since the second latching member 48 is capable of rotating with the first latching member 46 simultaneously, the first latching member 46 drives the second latching member 48 to rotate relative to the pivot member 52 in the second direction D2 when the first latching member 46 rotates in the second direction D2, until the data storage device 42 is located in the assembly position, as shown in FIG. 4. In the meanwhile, the second protruding structure 481 on the second latching member 48 latches the second hole 423 on the second side S2 of the data storage device 42 via the opening 501 of the installing member 50, and the first protruding structure 461 on the first latching member 46 latches the first hole 421 on the first side S1 of the data storage device 42 via the opening 501 of the installing member 50, simultaneously. In such a manner, the data storage device 42 can be fixed on the casing 38.

In summary, since the fixing mechanism 44 of the present invention utilizes the first protruding structure 461 and the second protruding structure 481 to respectively latch the first hole 421 and the second hole 423, the fixing mechanism 44 of the present invention can fix the data storage device 42 on the casing 38 of the first module 32 without utilizing screwing components such as screws. In addition, the first latching member 46, the second latching member 48 and the pressing member 54 are capable of rotating simultaneously. When the pressing member 54 is pressed, the first latching member 46 can be driven by the pressing member 54 and the second latching member 48, so as to lift the data storage device 42. When the data storage device 42 is installed onto the casing 38, the second latching member 48 is driven by the first latching member 46, so as to latch the data storage device 42. In such a manner, the fixing mechanism 44 of the present invention can utilize one single motion, i.e. operation of pressing the pressing member 54, to achieve releasing latching of the data storage device 42 and lifting the data storage device 42 simultaneously. As a result, the fixing mechanism 44 of the present invention facilitates users to replace and assemble the data storage device 42, so as to reduce labor time of assembly and disassembly of the data storage device 42.

In addition, the first latching member 46 can further include a pushing structure 463 protruding from the first protruding structure 461. In other words, the pushing structure 463 can formed on an end portion of the first latching member 46. When the pressing member 54 of the fixing mechanism 44 is pressed, the pushing structure 463 of the fixing mechanism 44 rotates with the first latching member 46 in the first direction D1. In the meanwhile, the pushing structure 463 is capable of pushing the data storage device 42, so as to lift the data storage device 42. On the other hand, when the data storage device 42 is installed onto the casing 38, the first side S1 of the data storage device 42 pushes the pushing structure 463 of the fixing mechanism 44, so as to drive the second latching member 48 and the first latching member 46 to rotate relative to the pivot member 52 in the second side S2, respectively. Accordingly, the first latching member 46 and the second latching member 48 respectively latch the first hole 421 and the second hole 423, so as to latch the data storage device 42.

Figure 7:
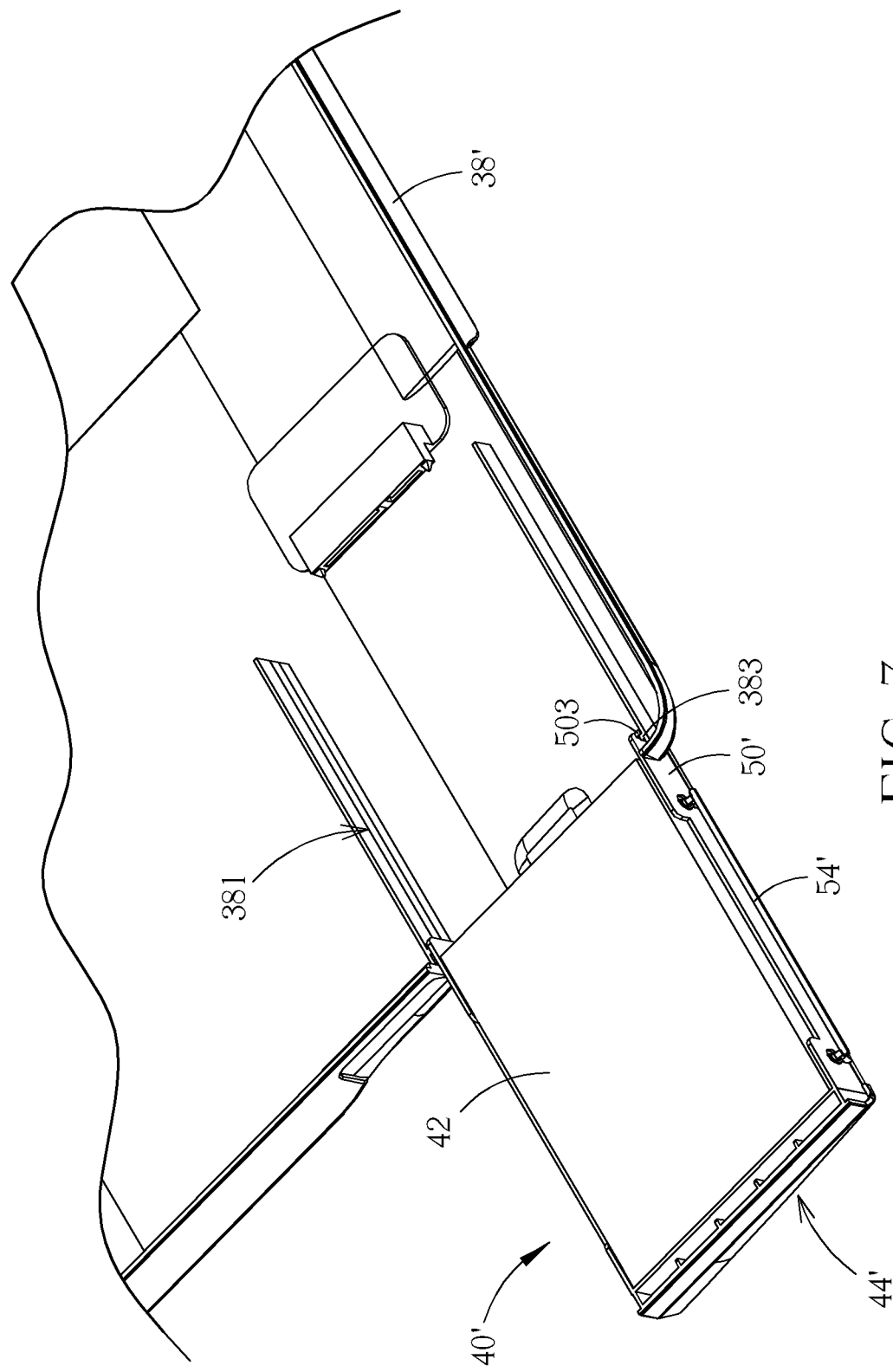
FIG. 7 is a diagram of a casing in an expanded status according to another embodiment of the present invention.
Figure 8:
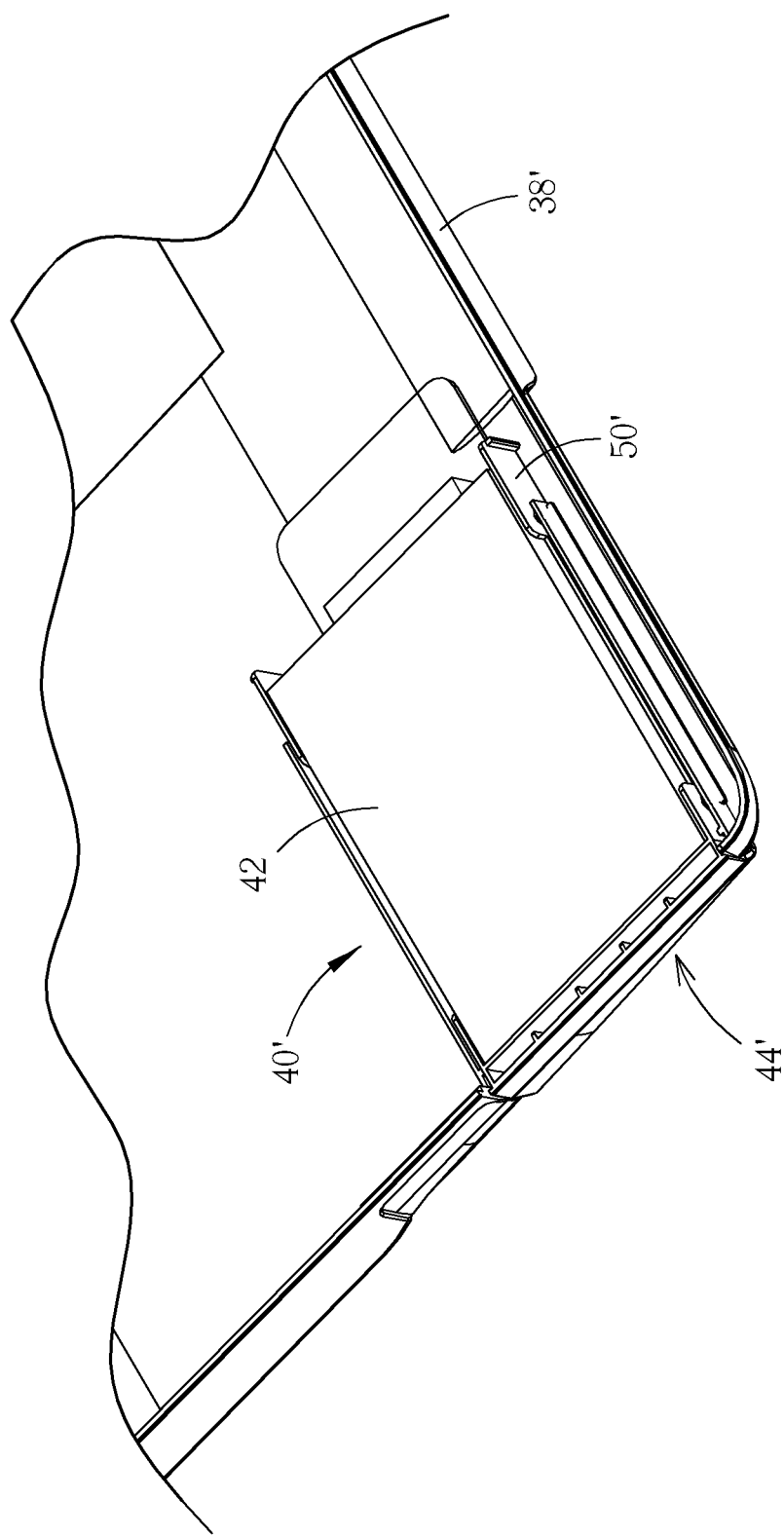
FIG. 8 is a diagram of the casing in a contained status according to another embodiment of the present invention.

Please refer to FIG. 7 and FIG. 8. FIG. 7 is a diagram of a casing 38' in an expanded status according to another embodiment of the present invention. FIG. 8 is a diagram of the casing 38' in a contained status according to another embodiment of the present invention. As shown in FIG. 7 and FIG. 8, the main difference between the casing 38' and the aforesaid casing 38 is that the casing 38' includes a guiding slot 381 and a pressing member 54' of the fixing mechanism 44' of the data storage module 40' is disposed inside the guiding slot 381 in a slidable manner. In addition, the installing member 50' of the data storage module 40' further includes a first stopping structure 503, and the casing 38' further includes a second stopping structure 383. When the data storage module 40' slides to a position where the second stopping structure 383 of the casing 38' stops the first stopping structure 503 of the installing member 50' by cooperation of the pressing member 54' and the guiding slot 381, the fixing mechanism 44' is located in an expanding position, as shown in FIG. 7. When the data storage module 40' slides to a position where the data storage module 40' is contained inside the casing 38' completely by cooperation of the pressing member 54' and the guiding slot 381, the fixing mechanism 44' is located in a containing position, as shown in FIG. 8. In summary, the fixing mechanism 44' of the data storage module 40' is capable of moving relative to the casing 38' between the expanding position and the containing position.

Figure 9:
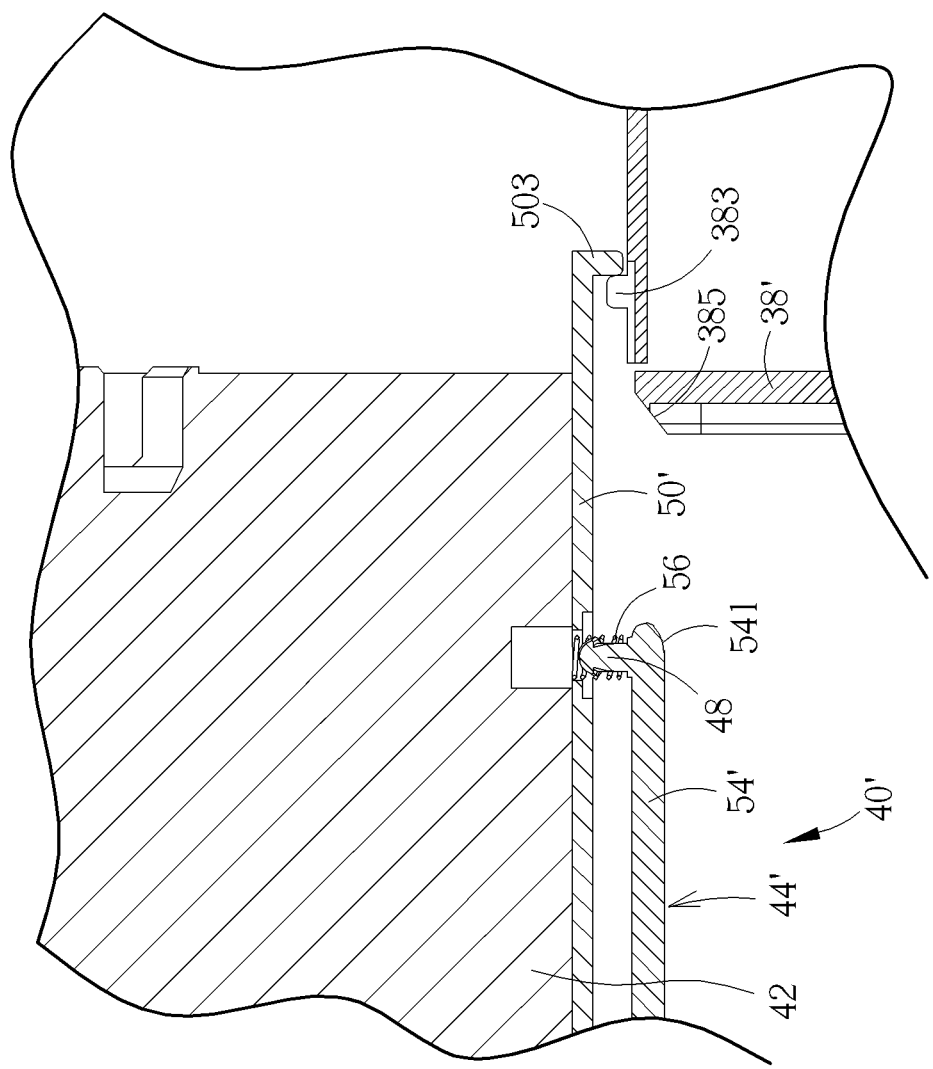
FIG. 9 is a partly sectional diagram of the casing and a data storage module according to another embodiment of the present invention.
Figure 10:
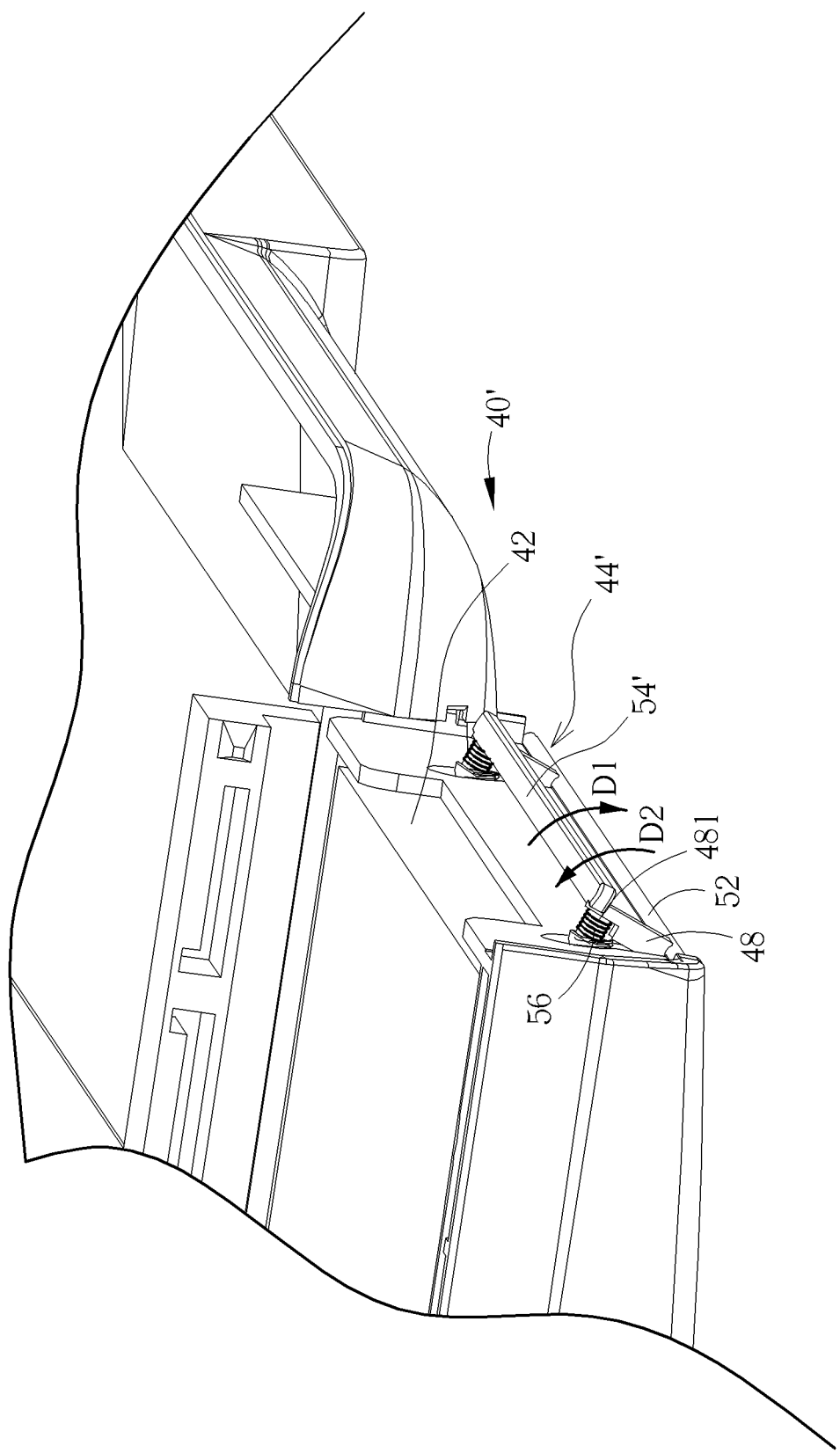
FIG. 10 is a partly diagram of the casing and the data storage module according to another embodiment of the present invention.

Please refer to FIG. 9 and FIG. 10. FIG. 9 is a partly sectional diagram of the casing 38' and the data storage module 40' according to another embodiment of the present invention. FIG. 10 is a partly diagram of the casing 38' and the data storage module 40' according to another embodiment of the present invention. As shown in FIG. 9 and FIG. 10, a first guiding structure 385 is formed on the casing 38', and a second guiding structure 541 is formed on the pressing member 54' of the fixing mechanism 44' of the data storage module 40'. When the data storage module 40' slides inside the casing 38' from the expanding position in FIG. 7 by cooperation of the pressing member 54' and the guiding slot 381, the second guiding structure 541 can cooperate with the first guiding structure 385, so as to guide the data storage module 40' to move from the expanding position to the containing position smoothly.

In addition, the data storage module 40' can further include a resilient member 56. The resilient member 56 sheathes on the second latching member 48 of the fixing mechanism 44', as shown in FIG. 10. When the data storage module 40' slides inside the casing 38' from the expanding position in FIG. 7 by cooperation of the pressing member 54' and the guiding slot 381, the resilient member 56 is pressed and stores a resilient potential energy. Accordingly, the second latching member 48 of the fixing mechanism 44' can rotate relative to the pivot member 52 in the second direction D2, so as to guide the data storage module 40' to move from the expanding position to the containing position smoothly. When the data storage module 40' slides from the containing position in FIG. 8 to a position where the pressing member 54' separates from the guiding slot 381 of the casing 38' by cooperation of the pressing member 54' and the guiding slot 381, the resilient member 56 releases the resilient potential energy and generates a corresponding resilient force, so as to drive the pressing member 54'. Accordingly, the first latching member 46 and the second latching member 48 of the fixing mechanism 44' can rotate relative to the pivot member 52 in the first direction D1, respectively. As a result, the first latching member 46 lifts the data storage device 42. Since principles for the fixing mechanism 44' to lift the data storage device 42 is similar to the aforesaid embodiment and components with the same denotes illustrated in all diagrams of the present invention have the same structures and functions, further descriptions are omitted herein for simplicity.

Compared to the prior art, since the present invention utilizes the first latching member and the second latching member to latch the first side and the second side of the data storage device, respectively, the present invention can omit screwing components such as screws. When the pressing member of the fixing mechanism of the present invention is pressed, the pressing member drives the second latching member to rotate in the first direction, so as to separate the second latching member from the second hole, such that the second latching member releases constraint on the data storage device. Furthermore, the pressing member simultaneously drives the first latching member to rotate in the first direction as well for lifting the data storage device. Accordingly, the fixing mechanism of the present invention is not only capable of fixing the data storage device without utilizing the screwing components, such as the screws, but also capable of lifting the data storage device when the second latching member releases constraint on the data storage device. In other words, the present invention can utilize one single motion, i.e. operation of pressing the pressing member, to achieve releasing latching of the data storage device and lifting the data storage device simultaneously. In such a manner, the fixing mechanism of the present invention not only facilitates users to take and replace the data storage device, but also simplifies assembly and disassembly process of the data storage device, so as to reduce labor time of assembly and disassembly of the data storage device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data storage module, comprising:
   a casing whereon a guiding slot and a first guiding structure are formed;
   a data storage device having a first side and a second side, a first hole and a second hole being respectively formed on the first side and the second side; and
   a fixing mechanism pivoted to the data storage device, comprising:
   a first latching member comprising a first protruding structure detachably inserting into the first hole;
   a second latching member connected to the first latching member, the second latching member comprising a second protruding structure detachably inserting into the second hole; and
   a pressing member connected to the second latching member, the pressing member driving the second latching member to rotate in a first direction when the pressing member is pressed to pivot relative to the data storage device in the first direction, so as to separate the second protruding structure from the second hole, and the first latching member being activated to rotate in the first direction by the second latching member, such that the first latching member pushes the first side for lifting the data storage device, wherein a second guiding structure is formed on the pressing member, the pressing member is slidably installed inside the guiding slot, such that the fixing mechanism moves relative to the casing between an expanding position and a containing position, as the fixing mechanism moves from the expanding position to the containing position, the second guiding structure cooperates with the first guiding structure for guiding and pressing the pressing member into the guiding slot so as to drive the second latching member to rotate in a second direction opposite to the first direction, such that the first latching member and the second latching member respectively engage in the first hole and the second hole.

2. The data storage module of claim 1, wherein the first latching member, the second latching member and the pressing member are perpendicular to one another.

3. The data storage module of claim 2, wherein the first latching member, the second latching member and the pressing member are integrally formed.

4. The data storage module of claim 1, wherein the fixing mechanism further comprising:
- an installing member assembled with the data storage device to install the data storage device onto the casing, openings being formed on the installing member and located in positions respectively corresponding to the first hole and the second hole, the first latching member and the second latching member passing through the openings, such that the first latching member and the second latching member latch the first hole and the second hole, respectively; and
- a pivot member disposed on the installing member, the pivot member being pivoted to the first latching member and the second latching member, such that the first latching member and the second latching member are capable of rotating simultaneously, when the pressing member is pressed in the first direction, the pressing member drives the first latching member and the second latching member to in the first direction, and when the data storage device is installed onto the casing, the first side of the data storage device presses the first latching member, such that the first latching member and the second latching member rotate in the second direction opposite to the first direction.

5. The data storage module of claim 4, wherein the first latching member comprises:
- a pushing structure protruding from the first protruding structure, the pressing member being pressed to rotate the pushing structure in the first direction, so as to lift the data storage device, the data storage device pushing the pushing structure to rotate the second latching member and the first latching member relative to the pivot member in the second direction when the data storage device is installed onto the casing.

6. The data storage module of claim 1, wherein the installing member comprises a first stopping structure, the casing comprises a second stopping structure, and the first stopping structure abuts against the second stopping structure when the installing member moves to the expanding position relative to the casing.

7. The data storage module of claim 1, wherein the fixing mechanism further comprises:
- a resilient member sheathing the second latching member, the resilient member driving the pressing member to rotate the first latching member and the second latching member respectively in the first direction when the pressing member is separated from the guiding slot.

* * * * *